(12) United States Patent
Usami et al.

(10) Patent No.: US 6,486,541 B2
(45) Date of Patent: *Nov. 26, 2002

(54) SEMICONDUCTOR DEVICE AND FABRICATION METHOD

(75) Inventors: Mitsuo Usami, Akishima (JP); Takashi Tase, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/953,913

(22) Filed: Sep. 18, 2001

(65) Prior Publication Data

US 2002/0027274 A1 Mar. 7, 2002

Related U.S. Application Data

(63) Continuation of application No. 09/542,296, filed on Apr. 4, 2000, now Pat. No. 6,291,877, which is a continuation of application No. 08/888,123, filed on Jul. 3, 1997, now Pat. No. 6,051,877, which is a continuation of application No. 08/280,935, filed on Jul. 27, 1994, now Pat. No. 5,689,136.

(30) Foreign Application Priority Data

Aug. 4, 1993 (JP) ............................................. 5-193267

(51) Int. Cl.⁷ ............................................... H01L 23/02
(52) U.S. Cl. ...................... 257/679; 257/487; 257/684; 257/688
(58) Field of Search ................................ 257/679, 487, 257/684, 688

(56) References Cited

U.S. PATENT DOCUMENTS

| | | | |
|---|---|---|---|
| 4,409,471 A | 10/1983 | Aigo | 257/907 |
| 4,463,971 A | 8/1984 | Hoppe et al. | 283/83 |
| 4,603,249 A | 7/1986 | Hoppe et al. | 257/679 |
| 4,931,853 A | 6/1990 | Ohuchi et al. | 257/679 |
| 5,155,068 A | 10/1992 | Tada | 438/977 |

(List continued on next page.)

FOREIGN PATENT DOCUMENTS

| | | |
|---|---|---|
| EP | 0350235 | 7/1989 |
| EP | 0383435 | 8/1990 |
| EP | 0486318 | 11/1991 |
| FR | 2-616270 | 6/1987 |
| FR | 2671417 | 1/1991 |

(List continued on next page.)

OTHER PUBLICATIONS

"Organic Chemistry" 3rd Ed., Morrisoni et al., Chapter 32, p. 1027 (pub. Allyn and Bacon, Inc.).

"Electronic Packaging and Interconnection Handbook", Harper (Editor), Chapter 1, part 1.2.1.8; p. 1.10–1.11; McGraw–Hill, Inc., 1992.

(List continued on next page.)

Primary Examiner—Fetsum Abraham
(74) Attorney, Agent, or Firm—Antonelli, Terry, Stout & Kraus, LLP

(57) ABSTRACT

A thin-film semiconductor device comprising at least a semiconductor element and a wiring is disclosed. A thin film of a protective insulating material is formed on the lower surface of the semiconductor element, and a substrate is bonded on the lower surface of the thin film. A method for fabricating the thin-film semi-conductor device is also disclosed, in which a thin-film semiconductor circuit is formed on a silicon-on-insulator wafer, the silicon substrate on the reverse side of the silicon-on-insulator wafer is etched off, a thin-film semiconductor chip is formed and attached to the of substrate, and the thin-film semiconductor chip and the substrate are wired to each other by printing.

26 Claims, 14 Drawing Sheets

U.S. PATENT DOCUMENTS

| | | | |
|---|---|---|---|
| 5,208,450 A | 5/1993 | Uenishi et al. | 257/679 |
| 5,362,667 A | 11/1994 | Linn et al. | 257/347 |
| 5,710,458 A | 1/1998 | Iwasaki | 257/679 |
| 6,051,877 A | 4/2000 | Usami et al. | 257/679 |
| 6,291,877 B1 * | 9/2001 | Usami et al. | |

FOREIGN PATENT DOCUMENTS

| | | |
|---|---|---|
| GB | 2096541 | 10/1982 |
| GB | 2253591 | 9/1992 |
| JP | 60-209883 | 10/1985 |
| JP | 61-145696 | 7/1986 |
| JP | 63-134294 | 6/1988 |
| JP | 1-209195 | 8/1989 |
| JP | 2-18096 | 1/1990 |
| JP | 2134860 | 5/1990 |
| JP | 2-0257626 | 10/1990 |
| JP | 3-87299 | 4/1991 |
| JP | 3-087299 | 4/1991 |
| JP | 3-150872 | 6/1991 |
| JP | 4-75379 | 3/1992 |
| JP | 4-0340251 | 11/1992 |
| JP | 5-291397 | 11/1993 |

OTHER PUBLICATIONS

Information Processing Handbook (1st. Ed.), pp. 242–244, 302–304, Information Processing Society (pub. Ohm Publishing, Co.,) May 30, 1989.

IC Cards (1st Ed.) The Institute of Electronics Information & Communications Engineer, p. 33, (Ohm Pub. Co.) Dec. 25, 1987.

Table of Physical Constants Maruzen pp. 24(444) & 25(445), 1998.

* cited by examiner

1

SEMICONDUCTOR DEVICE AND FABRICATION METHOD

This application is a continuation of application Ser. No. 09/542,296, filed on Apr. 4, 2000 and now U.S. Pat. No. 6,291,877, which is a continuation of application Ser. No. 08/888,123, filed on Jul. 3, 1997 and now U.S. Pat. No. 6,051,877 and which, in turn, is a continuation of application Ser. No. 08/280,935, filed on Jul. 27, 1994 and now U.S. Pat. No. 5,689,136; and the entire disclosures of all of which are incorporated herein by reference.

BACKGROUND OF THE INVENTION

The present invention relates to a reliable and low-cost semiconductor device, or more in particular to an IC (Integrated Circuit) card or a multichip module.

Conventional techniques for IC cards are described in "Information Processing Handbook", first edition, pp. 302–304, compiled by Information Processing Society of Japan and published by Ohm, May 30, 1989. The same reference contains at pp. 242–244 also the description of techniques for packaging the IC card. The structure of IC cards is described in "IC Cards", first edition, p. 33, compiled by The Institute of Electronics, Information and Communication Engineers and published by Ohm, May 25, 1990. Also, an IC card using a thin LSI is disclosed in JP-A-3-87299, Apr. 12, 1991.

FIGS. 1, 2 and 3 are sectional views showing configurations of IC cards.

In FIG. 1 showing a conventional IC card configuration, a chip 211 is bonded to a portion having a contact 210, connected to a printed board 212 by a bonding wire 216, and sealed by resin 215. This module is embedded in a center core 213 of a hard material. The card surface is covered with an oversheet 209 and an oversheet 214.

FIG. 2 shows another example of the prior art. A semiconductor chip is bonded to a substrate 207 by a adhesive agent 207a. Due to a thick silicon substrate 217, however, the semiconductor is connected by being bonded to the substrate 207 by the adhesive 207a while absorbing the unevenness through a bonding wire 218.

In the example shown in FIG. 3, an IC 6 has a great thickness of about 200 to 400 μm. This bulk IC 6 is bonded to a card board 8 by an adhesive 7. Since the bulk IC is thick, however, the uneven wiring patterns on the IC and a substrate wiring 10 are connected by a wire bonding 9. In this case, the bulk IC is easily subjected to bending stress and therefore stress relaxation is required. Also, in view of the limited sizes of the bulk IC, the structural requirement for improving the bending strength and the difficulty of reducing the number of wire-adhesive steps, the cost tends to increase.

JP-A-3-87299 (Apr. 12, 1991) has rendered well known an IC card configuration in which an IC module having a very thin LSI ground very thin leaving active elements is fitted in a surface recess.

This conventional configuration is shown in FIG. 4. A semiconductor element 204 is bonded on a substrate 207 by an adhesive 207a. A wiring 208 for connecting semiconductor elements is connected to a conductive pad 202 by way of a through hole 203. This conductive pad 202 is further connected to the wiring on the substrate 207 by conductive paste 201.

The problem of this configuration, as shown in FIG. 4, is that an adhesive layer is in direct contact with the lower surface of the semiconductor element 204 such as a transistor and ionic contaminants easily intrude the semiconductor element, thereby extremely deteriorating the reliability. FIG. 5 is a diagram showing a problem specific to an IC card configured using a thin LSI disclosed in JP-A-3-87299 (Apr. 12, 1991). A thin LSI 41 mounted on a thick card substrate 42 is subjected to tensile or compressive stress on the front and reverse surfaces when the card substrate 42 is bent, thereby exerting a large stress on the LSI chip. The resulting thin structure and low mechanical strength under a large stress causes the IC to be easily broken by the stress. This gives a rise to a new problem of a considerably reduced reliability.

As described above, the IC card using a thin LSI layer including a thin semiconductor element is easily affected by ionic contaminants. Also, the thinness leads to a low mechanical strength. In the conventional IC cards using a bulk LSI, a bulk IC chip is attached on a thin, easy-to-bend card and wire-bonded. Therefore, the IC is easily broken and is low in reliability. Further, the increased number of packaging steps makes a cost reduction difficult.

SUMMARY OF THE INVENTION

The object of the present invention is to solve the above-mentioned problems of the prior art and to provide a semiconductor circuit, or more in particular a IC card or multichip module high in reliability and low in cost.

According to one aspect of the invention for solving the above-mentioned problems, there is provided a thin-film semiconductor device comprising at least a semiconductor element and a wiring, wherein a thin film of a protective insulating material for protecting the semiconductor element is formed on the lower surface thereof in contact with the semiconductor element, and the surface of the protective insulating film is bonded to other substrate.

According to another aspect of the invention for solving the above-mentioned problems, there is provided a semiconductor device wherein the thin-film semiconductor circuit includes a thin film of a semiconductor circuit formed on a silicon-on-insulator (hereinafter referred to as SOI) wafer, another substrate coupling the thin-film semiconductor circuit on the opposite side formed with the semiconductor circuit, and a hardenable conductive material for connecting the wiring prepared on the substrate and the wiring of the thin-film semiconductor circuit.

According to a third aspect of the invention for solving the above-mentioned problems, there is provided a semiconductor de vice wherein the thin-film semiconductor circuit is taken out of the main surface of the SOI wafer with the insulator layer inward thereof as a boundary.

According to another aspect of the invention for solving the above-mentioned problems, there is provided a semiconductor device wherein the thin-film semiconductor circuit and the other substrate are bonded by a rubber-like adhesive.

According to another aspect of the invention, there is provided a semiconductor device wherein the main surface is bonded to another support substrate, and then the SOI wafer substrate is ground or etched off.

According to still another aspect of the invention for solving the above-mentioned problems, there is provided a semiconductor device wherein the other substrate for coupling the thin-film semiconductor circuit is of a flexible card shape.

According to a further aspect of the invention for solving the above-mentioned problems, there is provided a semiconductor device wherein the other support substrate is flexible.

According to a still further aspect of the invention for solving the above-mentioned problems, there is provided a semiconductor device wherein the thin-film semiconductor circuit and the support substrate are bonded to each other by an adhesive separable under ultraviolet ray.

According to an even further aspect of the invention for solving the above-mentioned problems, there is provided a semiconductor device wherein the wiring by a liquid conductive material is a printed wiring with a rotary drum.

According to another aspect of the invention for solving the above-mentioned problems, there is provided a semiconductor device wherein the thin-film semiconductor circuit is located at the center of the same depth from the front and reverse surfaces of the other substrate.

According to still another aspect of the invention for solving the above-mentioned problems, there is provided a semiconductor device wherein the thin-film semiconductor circuit is bonded to one substrate and covered by being bonded to the other substrate of the same thickness.

According to a further aspect of the invention for solving the above-mentioned problems, there is provided a semiconductor device wherein the thin-film semiconductor circuit is formed with a wafer other than SOI.

According to a still further aspect of the invention for solving the above-mentioned problems, there is provided a card-like semiconductor device with a thin IC chip built in the card, wherein the thickness of the IC chip is 110 microns or less for the completed card thickness of 760 microns or more, 19 microns or less for the completed card thickness of 500 microns or more, and 4 microns or less for the completed card thickness of 250 microns or more.

According to an even further aspect of the invention for solving the above-mentioned problems, there is provided a semiconductor device wherein the thickness of the IC chip is at least 4 microns or less for the completed IC card thickness 250 microns or less.

According to another aspect of the invention for solving the above-mentioned problems, there is provided a semiconductor device wherein the thin IC chip is located at the center along the thickness of the card.

According to still another aspect of the invention for solving the above-mentioned problems, there is provided a semiconductor device wherein the thin IC chip is held between two or more card substrates.

According to a further aspect of the invention for solving the above-mentioned problems, there is provided a semiconductor device wherein the thin IC chip is preferably bonded in such a configuration as to be held between card substrates by a flexible adhesive.

According to a still further aspect of the invention for solving the above-mentioned problems, there is provided a semiconductor device wherein the protective insulating material is silicon nitride.

The above-mentioned object can be achieved by providing a semiconductor device in which a semiconductor circuit prepared from a silicon-on-insulator (hereinafter referred to as SOI) wafer in thin film form is coupled to other substrate, to which a wiring prepared in advance and a wiring for the above-mentioned semiconductor circuit are connected by a liquid conductive material, and this liquid conductive material is then hardened.

This thin-film semiconductor circuit can be coupled to the other substrate after being taken out of the main surface with the insulator layer inward of the SOI wafer as a boundary. Specifically, the thin-film semiconductor circuit can be prepared by coupling the main surface of the semiconductor circuit formed of the SOI wafer to another support substrate and then by grinding or etching off the substrate of the SOI wafer.

The thin-film semiconductor circuit is preferably coupled to the other substrate by a rubber-like adhesive.

Also, the other substrate to which the thin-film semiconductor circuit is coupled preferably is card-shaped and flexible.

The other support substrate is also preferably flexible.

The thin-film semiconductor circuit and the other support substrate are bonded to each other by the use of an adhesive (hereinafter referred to as the ultraviolet-separating adhesive) the bonding strength of which decreases under ultraviolet ray, thereby facilitating separation of the other support substrate during the process.

Further, the liquid conductive material is effectively applied on the wiring by printing using a rotary drum.

Furthermore, the IC card can be easily fabricated by providing the thin-film semiconductor circuit placed at the center of the same depth from the front and reverse surfaces of the substrate, or more specifically, by bonding the thin-film semiconductor circuit to one substrate and then covering it by bonding with another substrate of the same thickness.

Although the foregoing description refers to the case of using a thin-film semiconductor circuit prepared on an SOI wafer, a similar effect of course is obtained by the use of a thin-film semiconductor circuit formed on a wafer other than SOI.

The above-mentioned method for attaching a protective insulating layer on the reverse surface of a thin semiconductor element causes the protective insulating film to prevent intrusion of ionic contaminants from the reverse side of the semiconductor element nearest to the external environment, and therefore the reliability is improved. As a result, an IC card with an improved durability can be fabricated even when a thin LSI is bonded to a substrate using a low-cost organic adhesive generally containing considerable ionic impurities.

The use of silicon nitride as the protective insulating film with a large thermal expansion coefficient suppresses the curl of the thin LSI film due to the internal residual stress, thereby contributing to an improved reliability of the IC card.

When an SOI wafer is used, the inner insulator layer acts as a stopper in processing, so that a thin film IC can be prepared uniformly with a high reproducibility. The thin-film IC thus prepared is 5 to 10 $\mu$m in thickness. This much thin IC is resistive to bend, and when bonded with a flexible adhesive to a thin substrate like an IC card, exhibits a high bending strength leading to a high reliability.

Also, the thin-film IC, which itself tends to break easily, is preferably mounted on a support substrate in advance to add stability. The support substrate to which the IC is coupled can be reliably removed at low temperatures by using an adhesive separable under ultraviolet ray. The thin-film IC attached to the card is so thin that wiring is possible with a conductive paste between the substrate and the IC. As compared with the conventional wire-bonding method using a gold wire, the method according to the invention is suited to mass production of flat, thin IC cards with low material cost.

The above-mentioned methods are applicable not only to the IC card but also to similar packaging of ICs as well as to multichip packaging.

Consider the section of a bent portion of a flat IC card. The curved surface develops an elongation and the reverse side thereof a compression. Under this condition, the central part of the section of the IC card is under a small stress free of compression. If a thin IC chip exists at this portion, such an IC chip is subjected to less stress. The IC chip is preferably thin. In the case where the card is thick, however, the card rigidity increases the critical curvature, thereby making it harder to bend. For this reason, the IC chip can be thick to some degree. In the case where the IC card is thin and easy to bend, on the other hand, the IC chip must also be reduced in thickness in order to relax the stress on the IC chip. In preparing a thin IC, the thinner the IC, the higher accuracy is required of fabrication devices. Changing the required IC chip thickness in accordance with the thickness of the IC card, therefore, is very important from the economic viewpoint and also for securing the required reliability. In this way, the correlationship between the thicknesses of the IC card and the IC chip is recognized to produce an economic and reliable IC card. Specifically, the thickness of the IC chip is rendered 110 microns or less for a card in completed form having the thickness of 760 microns or more, 19 microns or less for a card in completed form having the thickness of 500 microns or more, and 4 microns or less for a card in completed form having the thickness of 250 microns or more.

DESCRIPTION OF THE PREFERRED EMBODIMENTS

A semiconductor device having the configuration according to the invention will be specifically described with reference to embodiments. A sectional view of an embodiment of the invention is shown in FIG. 6.

Figure 1:
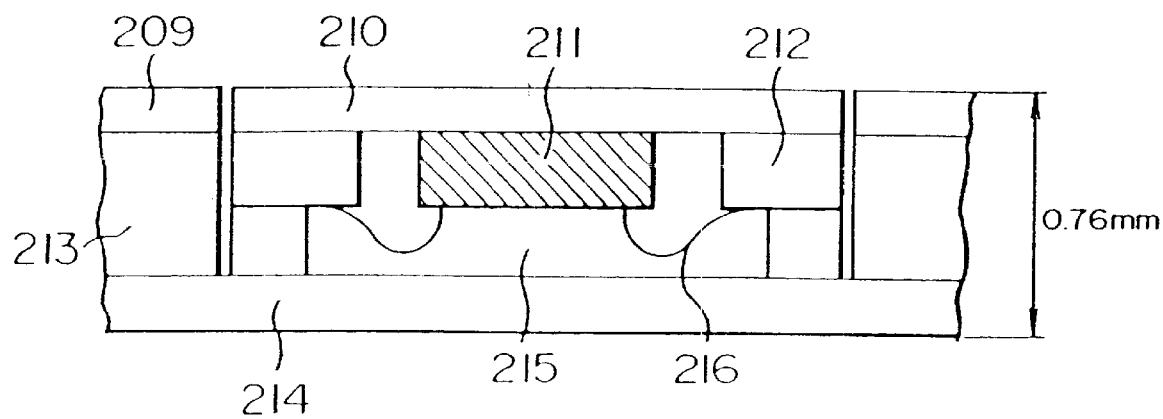
FIG. 1 is a sectional view showing the essential parts of a conventional IC card for explaining the present invention.
Figure 2:
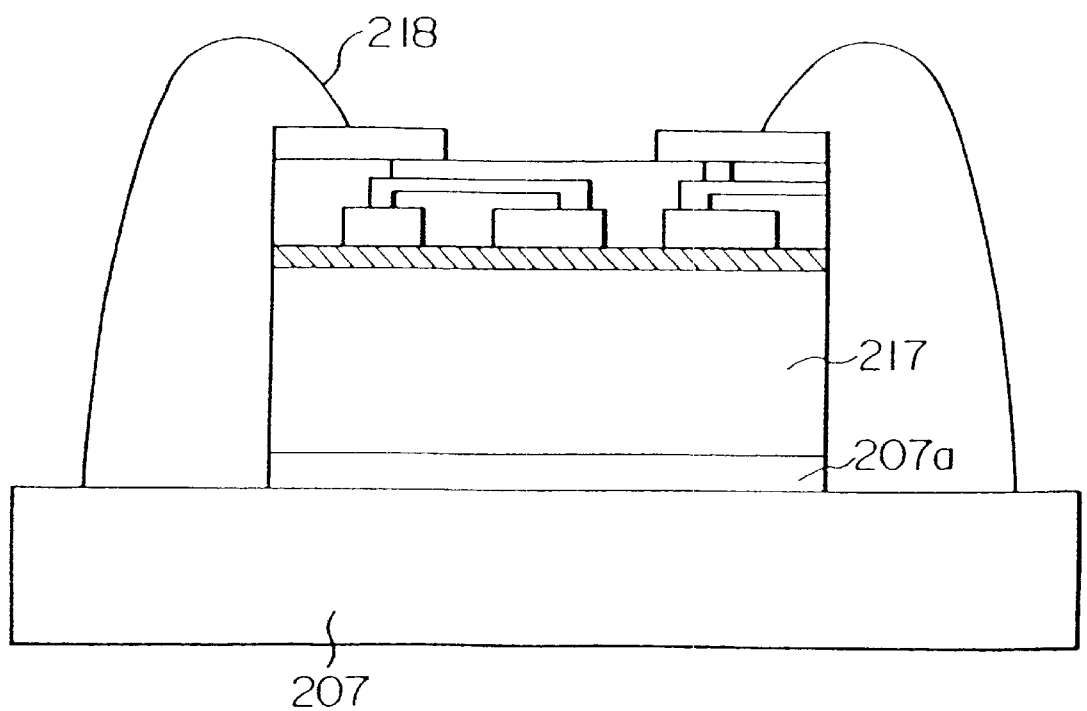
FIG. 2 is a sectional view showing the essential parts of a conventional IC card for explaining the present invention.
Figure 3:
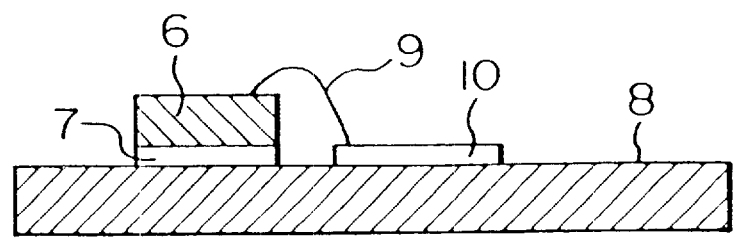
FIG. 3 is a sectional view showing the configuration of the essential parts of a conventional IC card.
Figure 4:
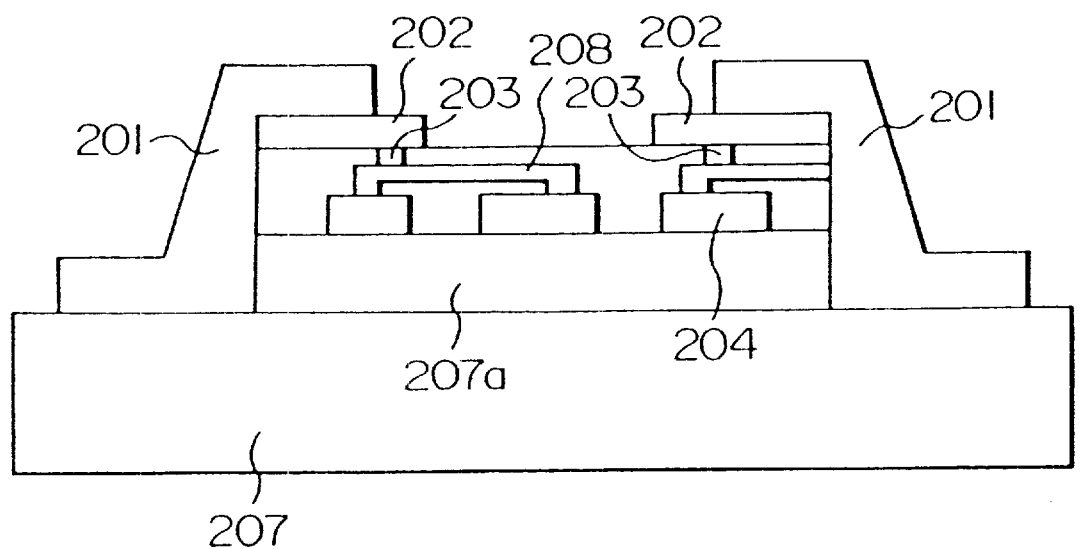
FIG. 4 shows the essential parts of a conventional IC card for explaining the present invention.
Figure 5:
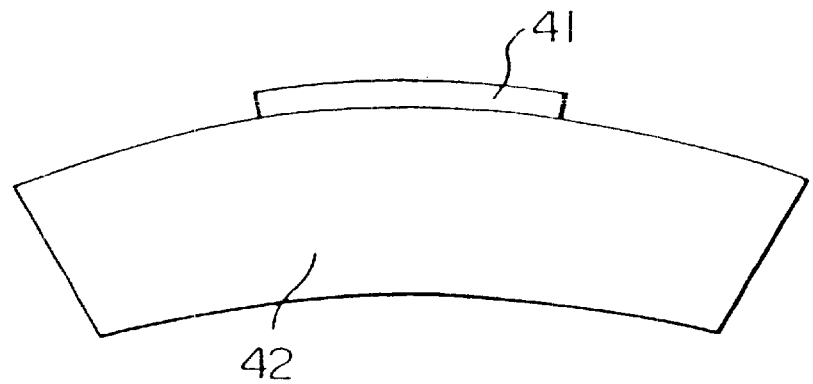
FIG. 5 is a sectional view showing the configuration of a conventional IC card bent with a thick substrate.
Figure 6:
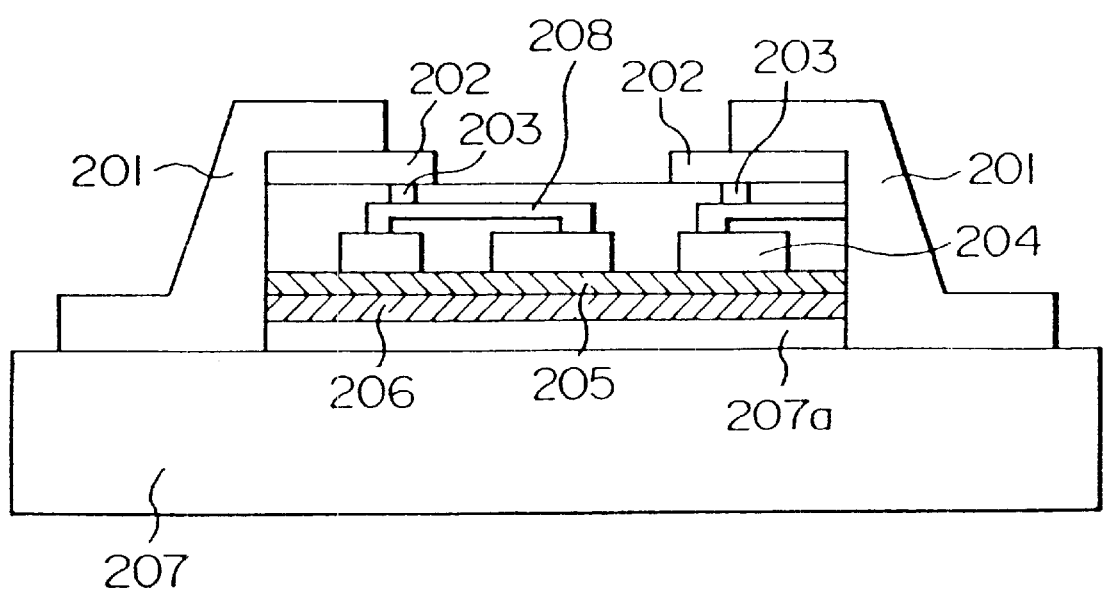
FIG. 6 is a sectional view showing the essential parts of a semiconductor device according to an embodiment of the invention.

In FIG. 6, a conductive paste 201 is connected to a pad 202 electrically coupled by way of a through hole 203 on a wiring 208, and thus electrically connected to components external to the chip. The wiring 208 connects semiconductor elements 204 thereby to form a circuit. The semiconductor elements 204 are bonded to a substrate 207 by an adhesive 207a through silicon nitride 206. The silicon nitride 206 is coated on the lower surface of silicon oxide 205.

The semiconductor element 204 has the lower surface thereof formed with the silicon oxide 205 for electrical isolation of the semiconductor element. The semiconductor element 204, which is prepared by use of layers of silicon-on-insulator (SOI) wafer, is formed very thin. At the same time, the silicon oxide 205 provides an inner insulator layer of the SOI wafer. The silicon oxide itself has no function of shutting off Na, $H_2$ or $H_2O$, resulting in the semiconductor element being contaminated by ionic substances and a protracted operating instability. Especially when the distance between the lower surface of the semiconductor element and the external environment approaches 10 microns or less with a silicon oxide as a thin film therebetween, impurities diffusion is included in the distance even at the LSI-operating temperatures, and a great problem is posed threatening the LSI reliability. With a thicker silicon oxide, by contrast, the wafer bends at temperatures higher than 1000° C. in the wafer processing steps, and the resulting misalignment or the like makes fine processing impossible. According to this embodiment, silicon nitride is attached after a thin LSI film is formed. The silicon nitride film has superior chemical, physical and electrical properties as a passivation film. Especially, its high imperviousness to Na, $H_2$ and $H_2O$ exhibits a superior effect of protecting the semiconductor elements of a thin LSI.

The thickness of the silicon nitride is, for example, one micron at maximum as a limit of developing a crack and about 0.01 micron at minimum taking the Na-ion diffusion range into account for the maximum operating temperature 90° C. of the IC card.

Figure 7A:
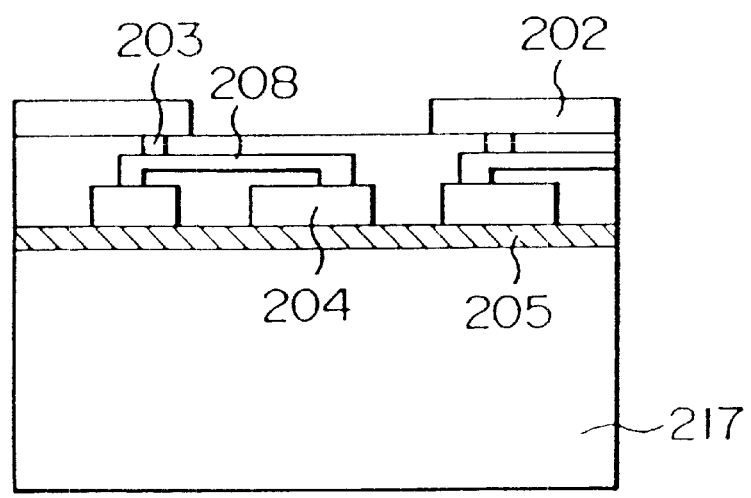
FIGS. 7A, 7B, 7C are sectional views showing the steps of fabricating the semiconductor device of FIG. 6.
Figure 7B:
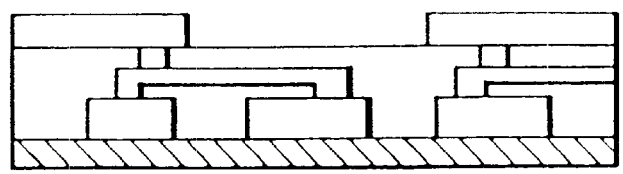
Figure 7C:
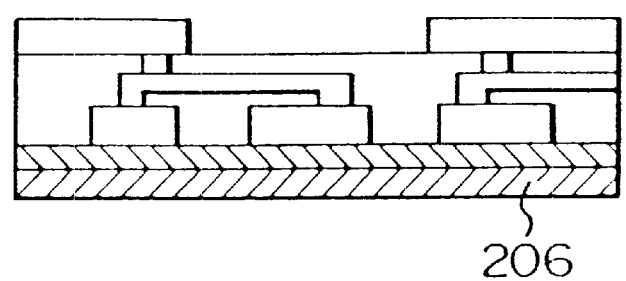

The steps for fabricating a semiconductor device in FIG. 6 are shown in FIGS. 7A, 7B, 7C. First, as shown in FIG. 7A, there is formed a semiconductor device comprising semiconductor elements 204, a wiring 208 for connecting the semiconductor elements 204 to each other, and a pad 202 on the wiring 208 each by way of a through hole 203, all of which are formed on the main surface of a silicon-on-insulator having a silicon oxide 205 on a silicon substrate 217.

Next, as shown in FIG. 7B, the silicon substrate 217 is selectively etched off by potassium hydroxide or hydrazine which has such a selective-etching function. Further, as shown in FIG. 7C, silicon nitride is coated on the reverse side of the silicon oxide 205. After that, as shown in FIG. 6, an LSI formed in thin film is bonded by the adhesive 207a and connected to the substrate using the conductive paste 201, thereby completing a semiconductor device.

The thin-film LSI is reduced to the thickness of the order of 10 microns, and therefore, after being bonded to the substrate, can be connected to the substrate by paste or ink-like liquid material due to a small unevenness with respect to the substrate. Consequently, a very low and flat connection is made possible in a shape optimal to an IC card. Also, the conductive paste, which is as thin as about 10 microns and high in flexibility, is highly resistive to bending and thermal expansion.

Figure 8:
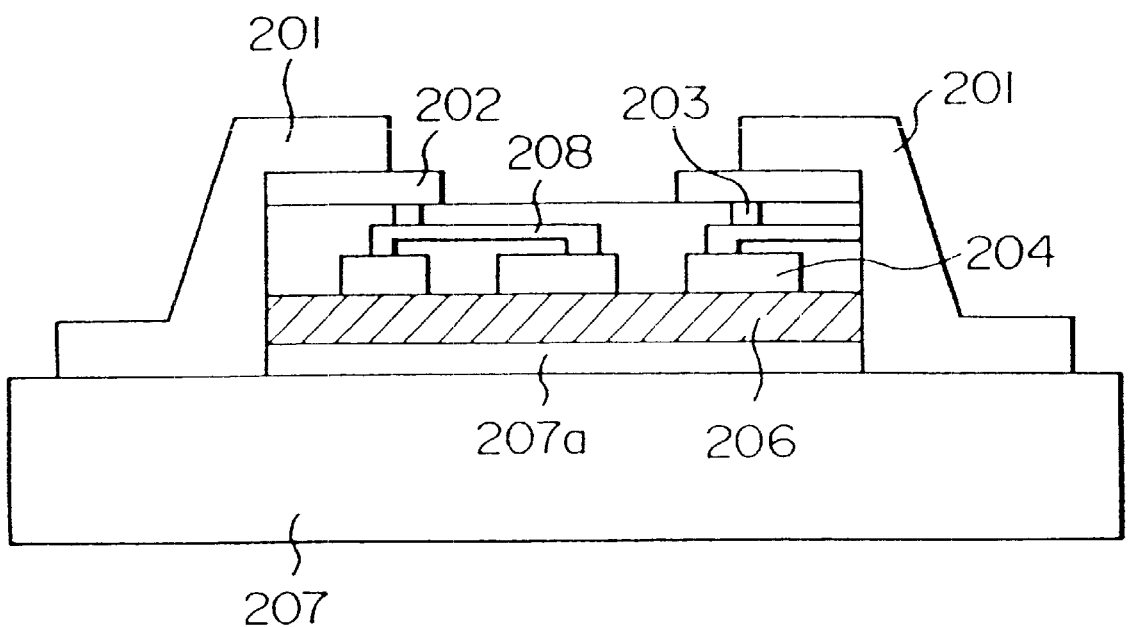
FIG. 8 is a sectional view showing the essential parts of a semiconductor device according to still another embodiment of the invention.

Another embodiment of the invention is shown in FIG. 8. In FIG. 8, a conductive paste 201 connected to a pad 202, which in turn is electrically connected to a wiring 208 by way of a through hole 203, is electrically connected to the environment external to the chip. The wiring 208 connects semiconductor elements 204 to each other thereby to form a circuit. The semiconductor elements 204 are bonded to a substrate 207 by an adhesive 207a through silicon nitride 206.

In the embodiment of FIG. 8, the silicon oxide film of FIG. 6 is replaced by a silicon nitride film. As a means of reducing the thickness of the LSI, though not restrictive, the lower surface of the semiconductor element is protected by silicon nitride after reducing the thickness. This silicon nitride film has the effect of regulating the thermal expansion coefficient and prevents the thin LSI from being curled due to the internal residual stress.

Figure 9:
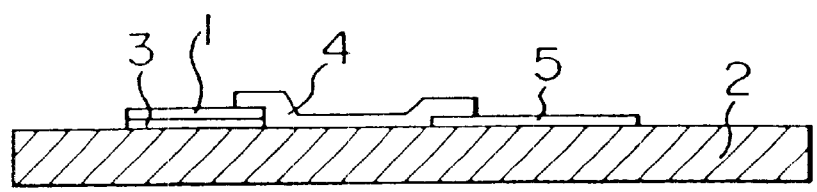
FIG. 9 is a sectional view showing the configuration of an embodiment of the invention.

FIG. 9 is a sectional view showing the configuration of a semiconductor device according to an embodiment of the invention. A thin-film IC 1 is bonded to a card substrate 2 by means of an adhesive 3. The thickness of the thin-film IC, depending on the number of layers of wiring and transistors employed, is in the range of about 5 to 10 $\mu$m. This thinness permits a substrate wiring 5 to be connected with the wiring pattern on the thin-film IC 1 by conductive ink 4. The thin-film IC, unlike the bulk IC, is easily bent, and therefore suitably is bonded to a substrate of plastics such as a card substrate which is also easy to bend. Also, a rubber-like or a flexible adhesive is preferably used for bonding the thin-film IC 1 and the card substrate 2. The rubber-like property and the flexibility reduce the bending stress acting on the thin-film IC.

Figure 10:
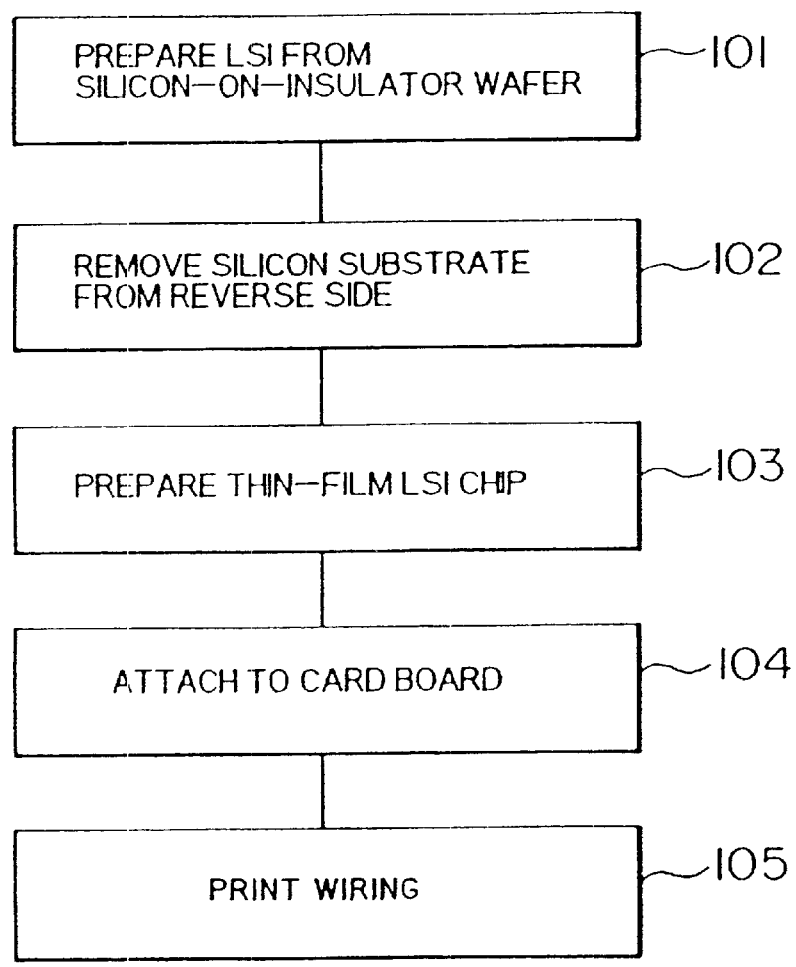
FIG. 10 is a diagram showing the steps of fabricating an IC card providing a semiconductor device according to an embodiment of the invention.
Figure 11:
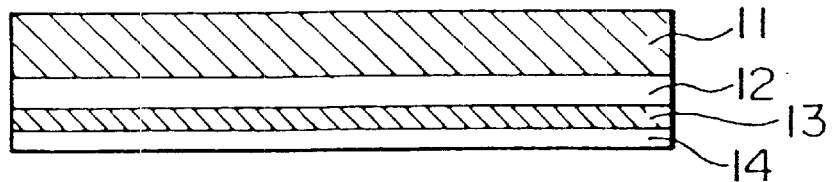
FIG. 11 is a sectional view showing a thin-film IC fabricated from a SOI wafer.

The steps of fabricating an IC card providing a semiconductor device according to an embodiment of the invention are shown in FIG. 10. First, a thin-film IC (LSI) is formed on a SOI wafer (step 101). Next, the silicon substrate on the reverse side is etched off by potassium hydroxide (step 102). In the process, the silicon oxide film inward of the SOI wafer cannot be removed by potassium hydroxide, and therefore the thin-film IC can be fabricated in self-aligning mode (step 103). Also, since the thin film IC, if alone, would curl due to the internal stress, the main surface of the SOI wafer is bonded in advance to a support substrate by adhesive. A sectional view of the SOI wafer with the silicon substrate removed is shown in FIG. 11. Numeral 11 designates the support substrate, numeral 12 the adhesive, numeral 13 the thin-film IC, and numeral 14 the insulator layer inward of the wafer. Then the thin-film IC is applied and bonded to the card substrate (step 104), and the support substrate is removed, finally followed by connecting the thin-film IC and a wiring terminal on the card substrate by printing (step 105).

As described above, an LSI based on a silicon-on-insulator wafer is attached on a card substrate in a very thin form with a high reproducibility over a wide range by etching with the inner silicon oxide film as a boundary layer, and thus can be wired to components external to the LSI by printing.

Figure 12:
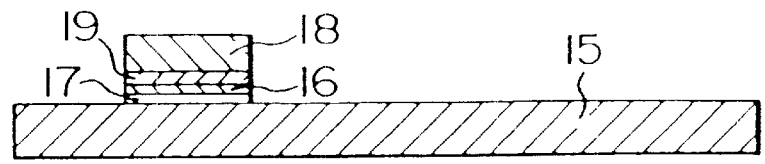
FIG. 12 is a sectional view showing a thin-film IC with a support substrate coupled to a card substrate.

FIG. 12 is a sectional view showing the condition immediately after bonding a thin-film IC with a support substrate to a card substrate. Under this condition, the thin-film IC 16 is bonded to a transparent support substrate 18 by an adhesive 19 separable under ultraviolet ray on the one hand and to a card substrate by a rubber-like adhesive 17 on the other hand. The adhesive separable under ultraviolet ray is of acrylic resin having an adhesive property under normal conditions and contains a gel substance which hardens under ultra-violet ray thereby to exhibit separability. This adhesive is effective in separating the support substrate at room temperature with high reliability. Also, the rubber-like adhesive 17 is capable of absorbing the stress caused when the card substrate is bent thereby to relax the stress concentration on the thin-film IC. Further, the stress concentration due to the difference in thermal expansion coefficient between the thin-film IC and the card substrate can be relaxed. Therefore, the thin-film IC can be bonded to the card substrate with high reliability.

Figure 13:
FIG. 13 is a sectional view showing a thin-film IC with the support substrate removed by irradiation of ultraviolet ray.

FIG. 13 is a sectional view showing the configuration of FIG. 12 from which the support substrate 18 is removed. The support substrate 18 is removed as it is not required once the thin-film IC 16 (designated by 20 in FIG. 13) is bonded to the card substrate 15 (designated by 21 in FIG. 13). Manual removal of the support substrate is facilitated by the use of an adhesive separable under ultraviolet ray which strongly bonds the thin-film IC to the support substrate 18 until radiation of the ultraviolet ray. In this way, a very thin IC card substrate can be bonded with high stability.

Figure 14:
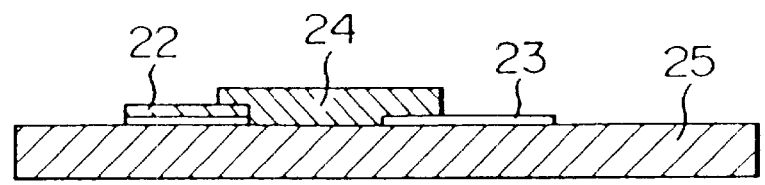
FIG. 14 is a sectional view showing the condition in which a thin-film IC and a substrate are connected with conductive ink.

FIG. 14 is a sectional view showing a configuration in which the thin-film IC 22 is bonded to the card substrate 25 and then the thin-wire IC is wired to the card substrate 25. The thin-film IC 22 has a thickness of about 5 to 10 $\mu$m, and the adhesive for bonding the thin-film IC to the card substrate 25 a thickness of about 20 to 30 $\mu$m. The unevenness between the upper surface of the card substrate 25 and the upper surface of the thin-film IC 22, therefore, is very small as compared with the conventional case in which a bulk IC is bonded to the card substrate. As a result, the thin-film IC and the wiring 23 on the card substrate can be connected to each other by the wiring 24 of conductive ink using the conventional printing technique. A great amount of connections is thus made possible within a short period of time. Mass production and cost reduction of IC cards are thus realized.

Figure 15:
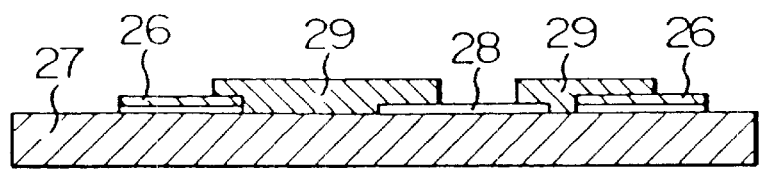
FIG. 15 is a sectional view showing a configuration of the invention used for a multichip module.

FIG. 15 shows an example in which the configuration of the invention is used for packaging a multichip substrate. A thin-film IC 26 prepared by the steps described above is bonded to a multichip substrate 27, and then conductive ink 29 is connected to a wiring 28 on the multichip substrate 27 by printing. A low-cost multichip module thus can be obtained.

The above-mentioned conductive ink may be of any liquid material.

Figure 16:
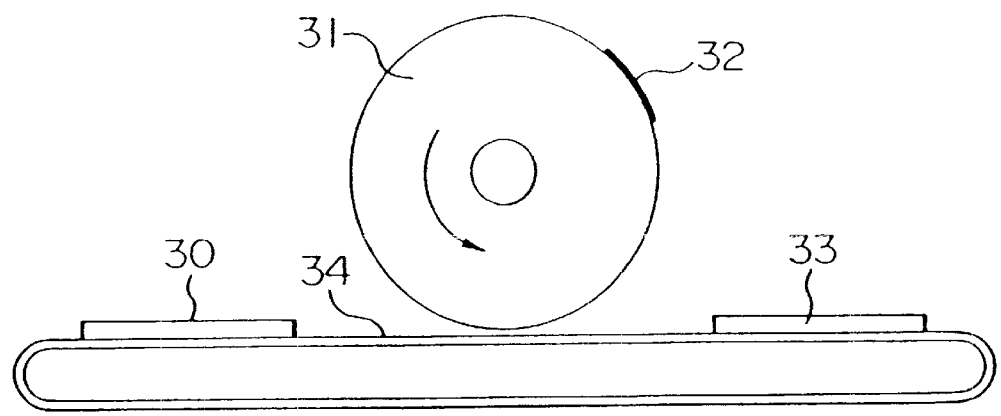
FIG. 16 is a sectional view of an apparatus for printing the wiring with conductive ink.

A printing unit used for fabricating a semiconductor device (IC card) according to the invention is schematically shown in FIG. 16. The IC card according to the invention has the feature that a great amount of connections is made possible within a short length of time between the IC and the card substrate. The ink 32 in a wiring pattern is transferred to a rotary drum 31 and further to a substrate (before printing) 30 carrying a thin-film IC thereon on a belt 34 passing along the side of the rotary drum rotating in high speed, thereby realizing a device delivered as a substrate (after printing) 33 carrying a thin-film IC.

Figure 17:
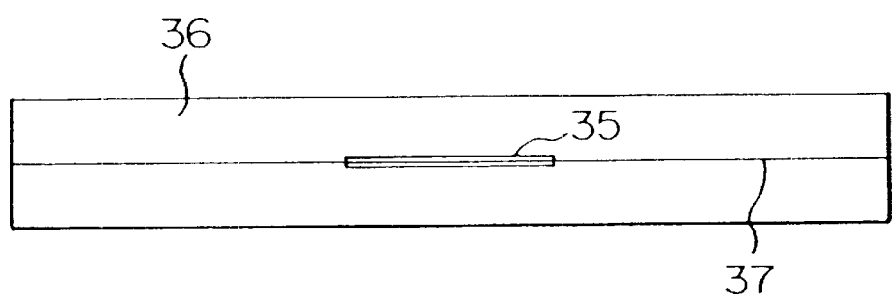
FIG. 17 is a sectional view showing a thin-film IC embedded in a card substrate.

FIG. 17 is a sectional view showing an example of the thin-film IC embedded in an IC card. The thin-film IC 35 is placed in a neutral plane 37 of the card substrate 36 in such a manner as to resist the bend of the card substrate 36. Although when the card substrate is bent, a tensile or compressive stress is exerted on the front and reverse sides, a thin-film IC located in a neutral plane 37 is not subjected to such a force, thereby leading to a high bending strength and high reliability.

The industrial productivity and the reliability of the card are improved by locating the LSI within about ±5% of one half of the IC card thickness from the ideal neutral plane.

Figure 18:
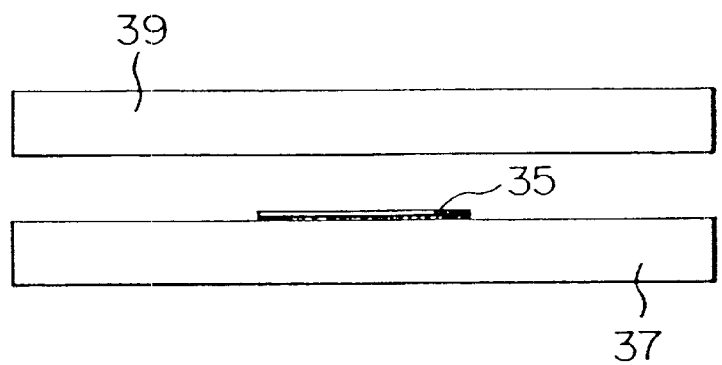
FIG. 18 is a sectional view for explaining the steps for producing the configuration shown in FIG. 17.

FIG. 18 is a diagram for explaining the steps for producing the configuration shown in FIG. 17. First, a thin-film IC 35 is adhered to a card substrate 36 and then a card substrate 36' of the same thickness as the card substrate 36' is attached to the thin-film IC 35. As seen from the configuration shown in FIG. 17, the thin-film IC can thus be easily embedded in the neutral plane of the IC card. A plurality of such thin-film cards IC can be located at arbitrary positions of the card substrate.

Figure 19:
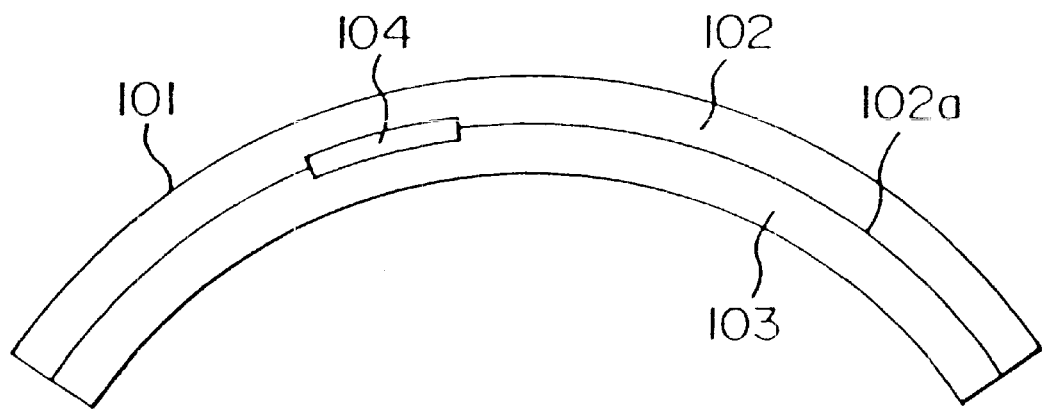
FIG. 19 is a sectional view showing the essential parts of an IC card according to an embodiments of the invention.

An embodiment of the invention is shown in FIG. 19. In the sectional view of FIG. 19, the IC card is curved under the bending stress. The thin-film LSI chip 104 is located on the center line 102a, i.e., the neutral plane of the card section, and therefore is highly resistive to the bending force. In other words, no stress is exerted on the thin-film LSI chip. Although the thin-film LSI chip is bent with the IC card, the small thinness of the thin-film LSI chip reduces the stress.

Figure 20:
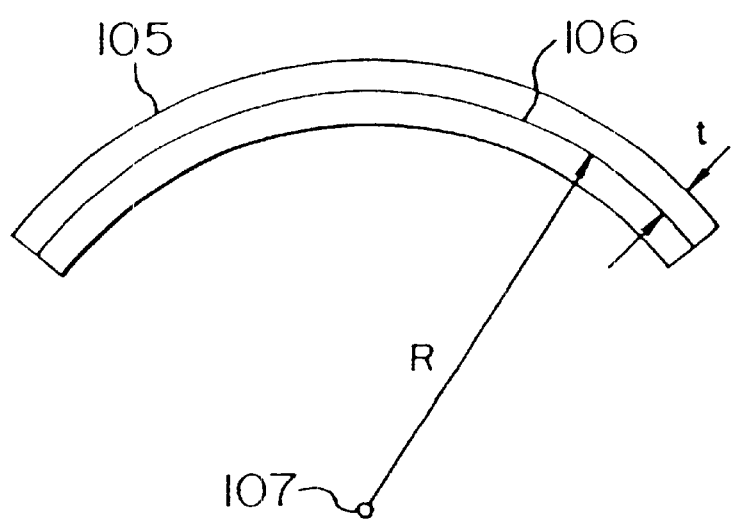
FIG. 20 is a sectional view of the essential parts of an IC card for explaining the principle of the invention.

FIG. 20 is a diagram showing the LSI chip 105 in bent state. Character R in FIG. 20 designates the radius of curvature from the center of curvature 107 to the center line 106 along the thickness of the LSI chip 105, and character t the thickness one half of the LSI. Navier's theorem shows that the stress a in LSI surface is represented by $E*t/R$, where E is may be considered Young's modulus of the LSI. Since the LSI surface is of silicon oxide, E is equivalently Young's modulus of silicon oxide. This equation indicates that the stress in the LSI surface is proportional to the thickness of the LSI and inversely proportional to the radius of curvature. The LSI is considered to break due to bend when the surface stress exceeds the mechanical strength of the LSI. The surface stress is zero in the absence of bend since R is infinitely large. With the progress of bend and the decrease in R, the stress is progressively increased until finally the LSI is broken. As the LSI thickness decreases with respect to the bend of the same radius of curvature, the surface stress decreases. An LSI sufficiently resistive to bend, therefore, is realized by reducing the thickness to such a degree as not to reach the limit of mechanical breakdown. A thin LSI which stands alone, however, is difficult to handle. The handling is facilitated and strength of a thin LSI increased by holding it between plastics or metal materials. In the process, it is necessary to position the thin-film LSI chip in the neutral plane of the material used for holding. In the case of an IC card, for example, the thin-film LSI chip is required to be located in the neutral plane as viewed from the section of the card substrate as shown in FIG. 19. In this way, the neutral plane of the LSI coincides with the plane where stress exerted is zero when the card is bent. Even if the card is bent, the same effect is expected as if the thin-film LSI chip alone is bent.

Figure 21A:
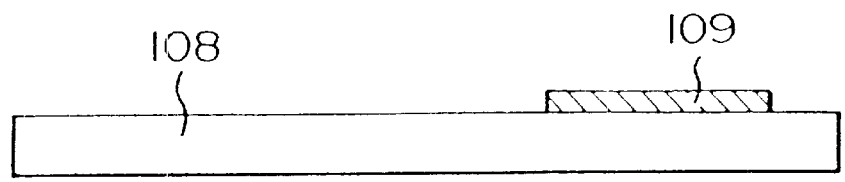
FIGS. 21A, 21B are sectional views of the essential parts of an IC card showing the fabrication steps thereof according to an embodiment of the invention.

Now, a method for forming a card using a thin LSI will be explained with reference to embodiments shown in FIGS. 21A, 21B and FIGS. 22A, 22B. First, as shown in FIG. 21A, a metallization pattern 109 is formed on a lower card substrate 108.

Figure 21B:
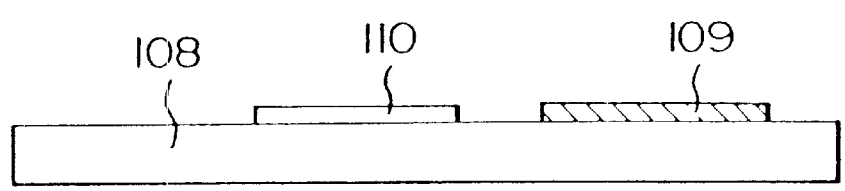
Figure 22A:
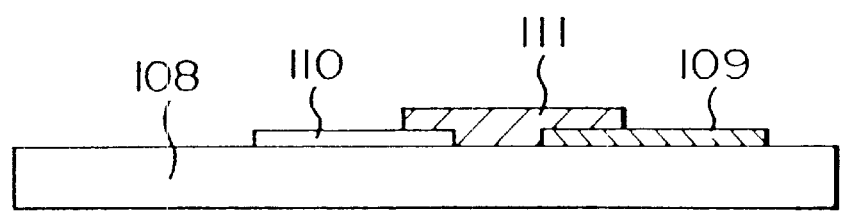
FIGS. 22A, 22B are sectional views of the essential parts of an IC card showing the fabrication steps thereof according to another embodiment of the invention.
Figure 22B:
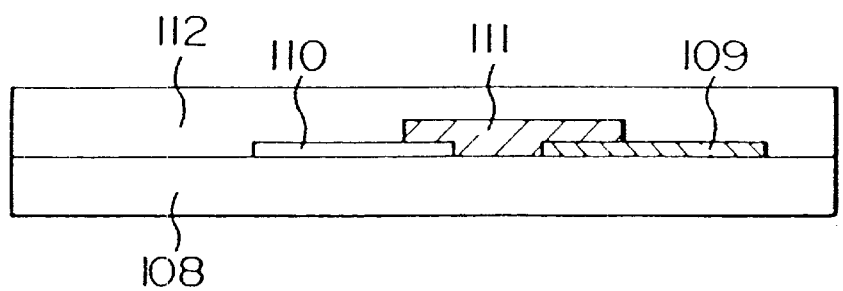

The metallization pattern 109 is formed using conductive paste or ink or etching of a copper thin film. Under this condition, as shown in FIG. 21B, a thin-film chip 110 is applied. An ordinary adhesive may be used for this purpose. In FIG. 22A, the thin-film chip 110 is connected by conductive paste 111, after which an upper card substrate 112 is bonded as shown in FIG. 22B. In the process, the lower card substrate 8 and the upper card substrate 12 are required to have the same thickness. In this way, the thin-film LSI chip is located in the neutral plane of the completed card and therefore has a high resistance to bending stress. As compared with the conventional card, the card according to this embodiment can be fabricated by integrating the card substrate with the LSI. Also, the connection using a conductive paste eliminates the need of wire bonding and makes possible fabrication of a low-cost, thin IC card resistive to bend.

Figure 23:
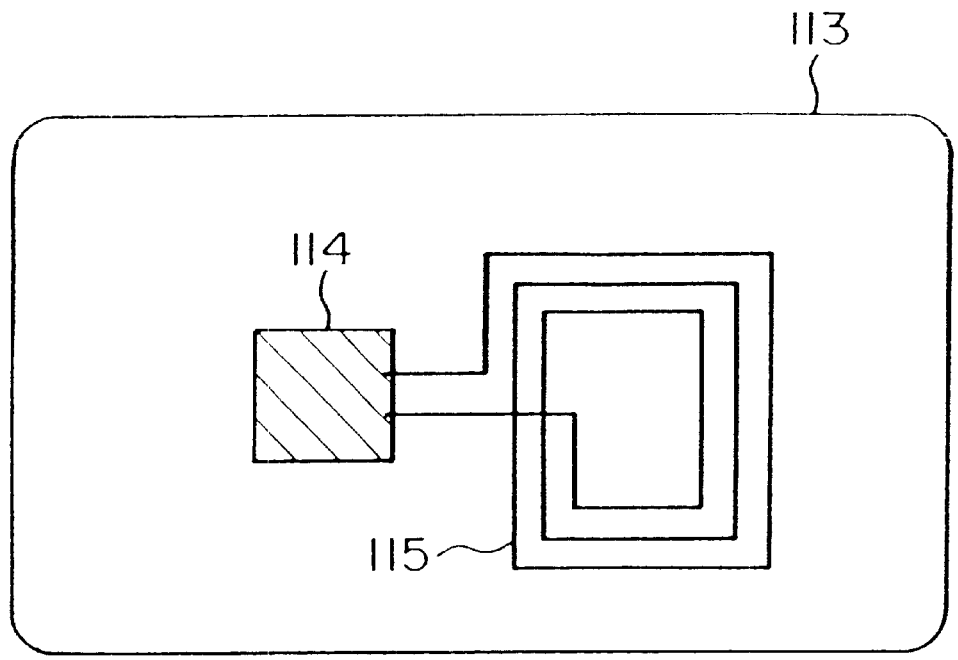
FIG. 23 is a plan view of an IC card according to still another embodiment of the invention.
Figure 24:
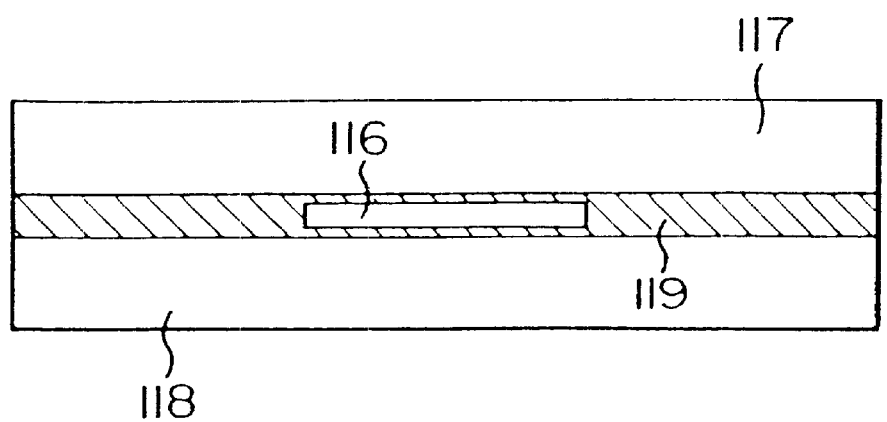
FIG. 24 is a sectional view of an IC card according to a further embodiment of the invention.

A top plan view of an IC card according to the invention is shown in FIG. 23. A thin-film LSI chip 114 and a conductor pattern 115 are formed on a flat IC card surface 113. A coil is shown as an example of conductor pattern. This coil has the function of generating an inductive electromotive force in response to an electro-magnetic wave received from the environment external to the IC card and supplying energy to the thin-film LSI chip. This coil pattern is connected to the thin-film LSI chip by the conductive paste. This coil has also the function of receiving data from outside of the IC card and delivering it to the thin-film LSI chip and sending the data from the thin-film LSI chip as an electro-magnetic wave out of the IC card. The thin-film LSI chip, if situated at a corner of the card smaller in bending moment than at the center as viewed from the flat card surface, can be reduced in radius of curvature and an IC card is realized with a higher strength to the bending force. This method permits fabrication of an IC card of non-contact type which is high in reliability. The conventional IC card classified as a contact type has an electrode in the surface thereof, and therefore has the disadvantages of developing a contact failure or easily succumbing to static electricity. The configuration according to the invention, however, is applicable also to the conventional IC card of contact type. FIG. 24 is a diagram showing an IC card having a configuration in which a thin-film LSI 16 is bonded in such a position as to be surrounded by a flexible adhesive 119 like silicone. This configuration enables the adhesive 119 to cover the thin-film LSI chip with a soft rubber-like material by taking advantage of the function of bonding the upper card substrate 117 and the lower card substrate 118. Stress is thus made difficult to be exerted on the surface of the LSI, while at the same time making it possible to fabricate an IC card resistive to the bending force. Further, even when the card substrate is deformed by a very local impact force, the adhesive layer exhibits the function of relaxing the impact force, thereby preventing stress from being applied to the thin-film LSI chip.

Figure 25:
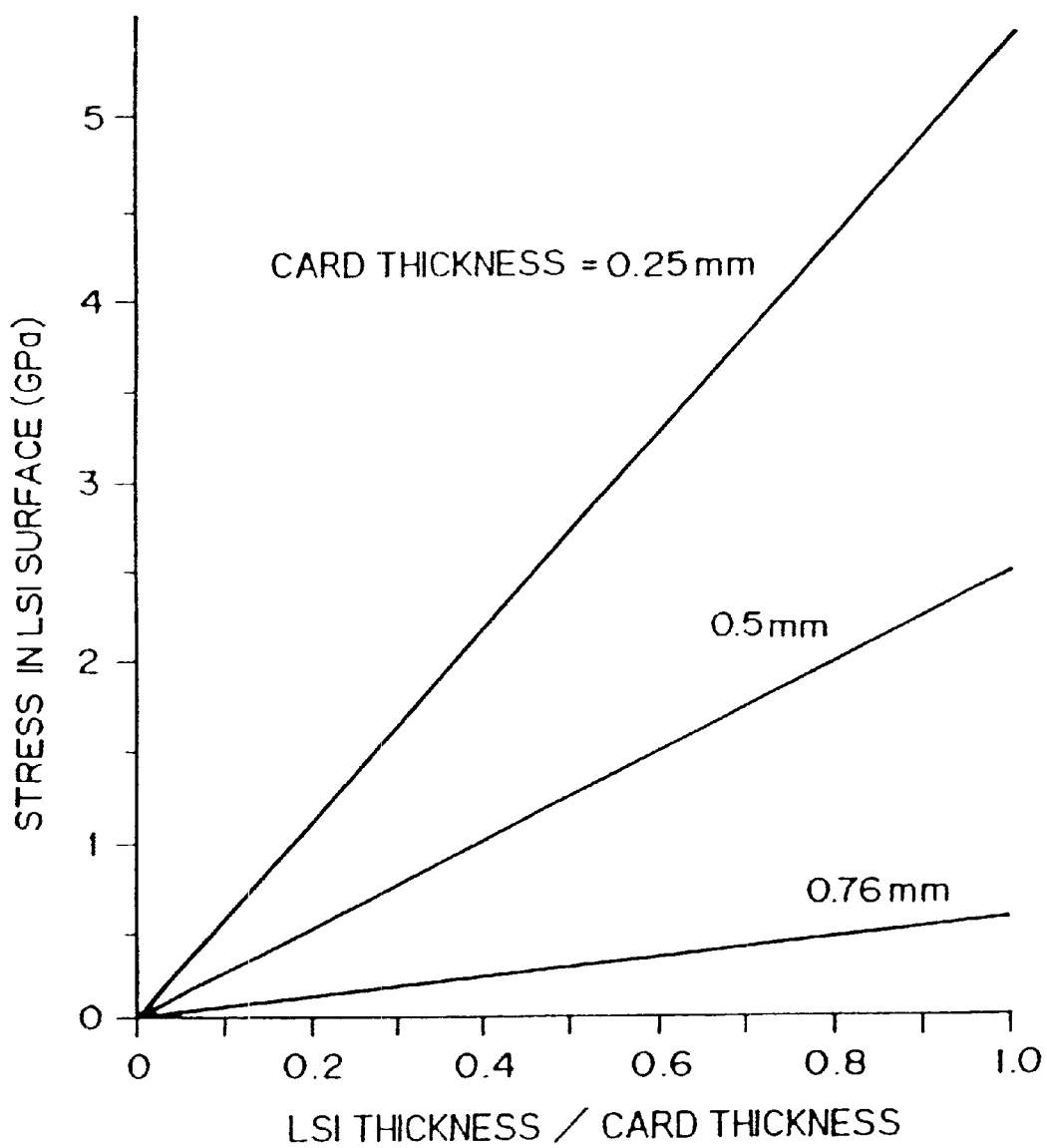
FIG. 25 is a diagram showing the relation between LSI-card thickness ratio and LSI surface stress according to the invention.

FIG. 25 is a diagram showing the stress exerted on the LSI surface with the card thickness as a parameter. The thin-film LSI is placed in the neutral plane of the card substrate, and the ratio is taken between the thickness of the LSI and that of the card to determine the stress exerted on the surface of the thin-film LSI. The stress in the LSI surface is considerably related to the degree of card curvature. The degree to which the card is bent depends to a large measure on the thickness or material of the card, the force applied to the card and the card position, and cannot be uniquely determined. By way of explanation, the position of the LSI is considered at the center in the neutral plane of the card, and the material of the card is deemed vinyl chloride commonly used for magnetic and IC cards. The PET (polyethylene terephthalate which is a heat-resistant crystalline thermoplastic) material is harder and more difficult to bend. The case involving vinyl chloride, therefore, is considered applicable to considerably wide purposes. The radius of curvature which determines the bend depends on the bending moment applied to the card. Such a moment is assumed to be applied to the limit of bending the card. A simple actual measurement shows that a vinyl chloride card 0.76 mm thick has a radius of curvature of 50 mm at the center thereof. Suppose the LSI has the same thickness as the card. The stress in the LSI surface is given as 8E10*0.38/50 (Pa) from the stress equation, which is calculated as 600 MPa. Taking into account the fact that LSI surface is mainly composed of a silicon oxide layer, the property of glass can be safely assumed. The value for glass was used as Young's modulus based on the standard table of physical constants.

Figure 26:
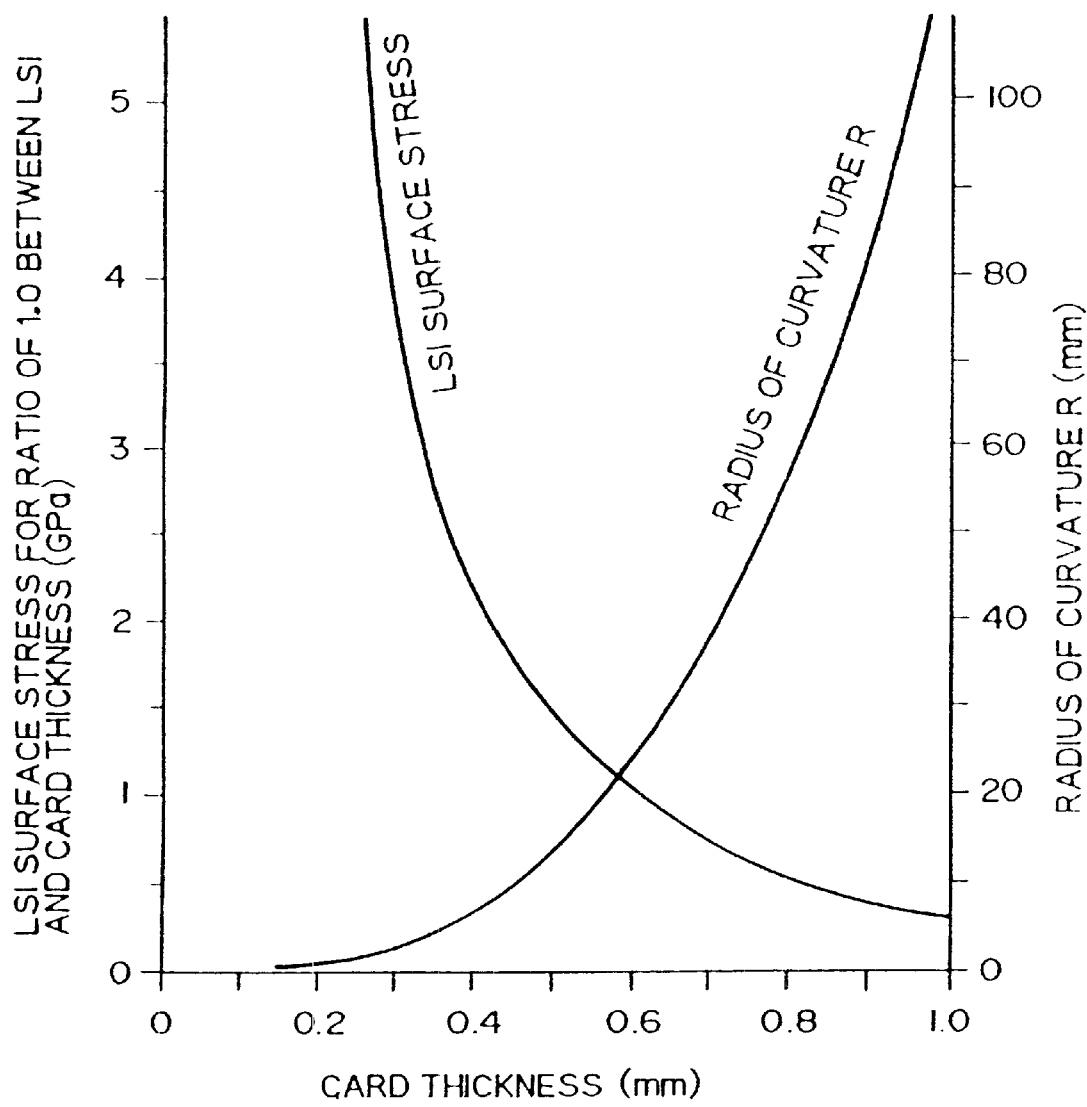
FIG. 26 is a diagram showing the relation between radius of curvature and LSI surface stress against IC card thickness according to the invention.

The relation between radius of curvature and card thickness is affected by the moment of inertia applied to the card. The radius of curvature R is given as E*I/M, where E is Young's modulus of the card, I the moment of inertia and M the bending moment. The moment of inertia of the card is proportional to the cube of card thickness. As a result, the characteristic curve of radius of curvature as shown in FIG. 26 is obtained.

Figure 27:
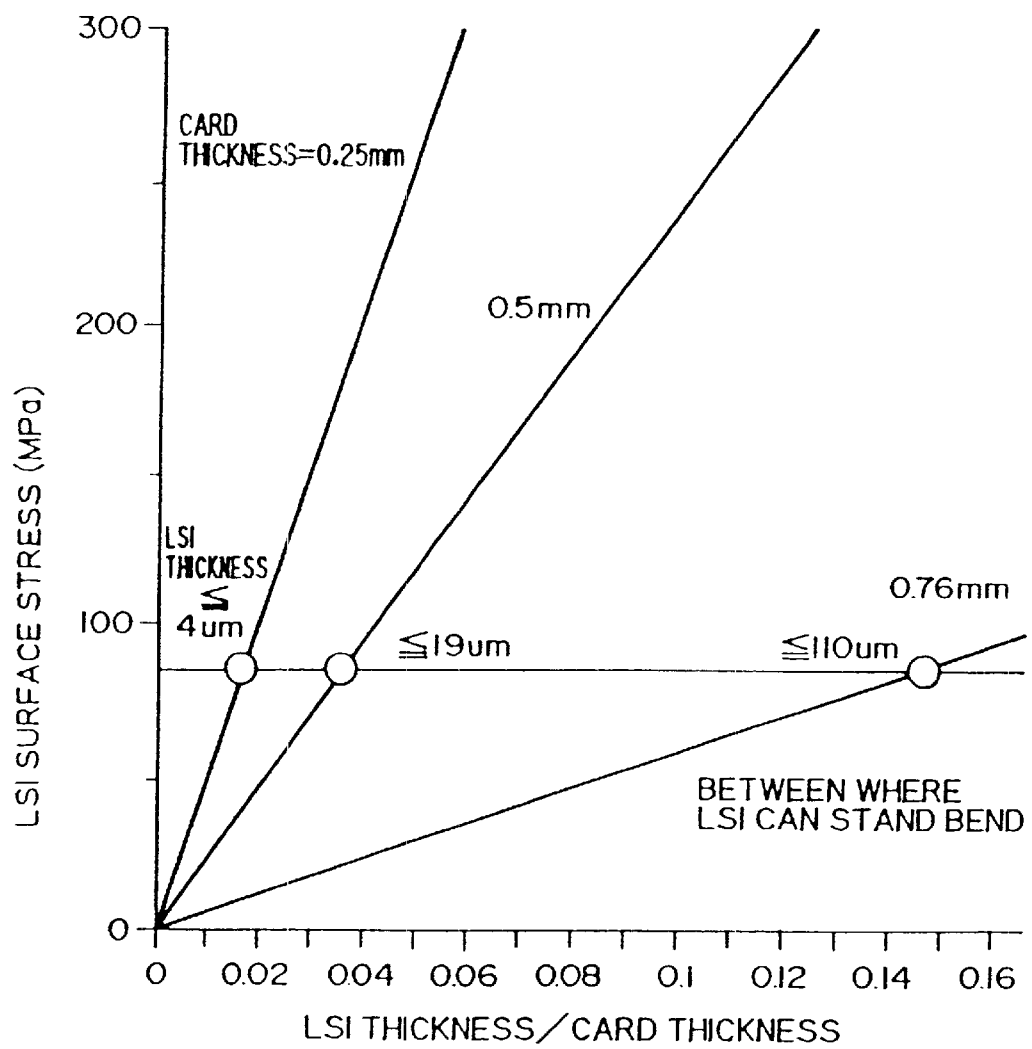
FIG. 27 is a diagram showing the relation between LSI-card thickness ratio and LSI surface stress according to the invention.

From this characteristic, the stress in the LSI surface is determined for the ratio of 1.0 between the thickness of LSI and that of the card. As in the equation previously noted, the stress in the LSI surface as shown in FIG. 26 is determined. More specifically, the stress figure is 2.4 GPa for the card thickness of 0.5 mm, and 5.4 GPa for the thickness of 0.25 mm. Under this condition, the LSI tends to easily break. Actually, therefore, the LSI is formed in thin film and held in the neutral plane of the card. FIG. 25 is a diagram showing the stress in the surface of the thin LSI plotted against the thickness ratio between LSI and card as a parameter. This graph is shown in enlarged form in FIG. 27 with the thickness ratio between LSI and card expanded in the range of 0 to 0.16. The region where the LSI can stand the bend is assumed to be 90 MPa and the same as the breaking strength of glass based on the standard table of physical constants. As a result, the thickness required of the thin-film LSI can be determined for each card thickness, and hence the limit to which the LSI thickness can be reduced. In other words, the required LSI thickness is 110 microns or less for the card thickness of 0.76 mm, 19 microns or less for the card thickness of 0.5 mm, and 4 microns or less for the card thickness of 0.25 mm. The reliability of course can be greatly improved by reducing the LSI thickness to the limit.

As described above, a semiconductor device configured according to this invention solves the problems of the prior art, and provides a reliable, low-cost IC card or a multichip module. In other words, a thin semiconductor element with a protective insulating layer covered on the reverse side thereof according to the method described above prevents intrusion of ionic contaminants by way of the reverse side of the semiconductor element nearest to the external environment for an improved reliability. As a consequence, an IC card with an improved durability can be fabricated by bonding a thin LSI to a substrate using an inexpensive organic adhesive usually containing a considerable amount of ionic impurities.

If silicon nitride is used as the above-mentioned protective insulating layer which is high in thermal expansion coefficient, the curling of the thin-film LSI due to the internal residual stress can be suppressed, thereby contributing to an improved reliability of the IC card.

On the other hand, the use of a SOI wafer permits the inner insulator layer to function as a stopper layer in fabrication processes and therefore a very thin IC can be fabricated with a superior reproducibility. The thin-film IC has a thickness of 5 to 10 $\mu$m. Such a thin IC as this is resistive to bend, and when coupled to a thin substrate like an IC card by flexible adhesive, is further improved in bend resistance for an improved reliability.

Also, a thin-film IC, which by itself is fragile, can be fabricated in highly stable form by being mounted on a support substrate in advance. The support substrate to which the IC is coupled can be reliably removed at low temperatures if an adhesive separable under ultraviolet ray is used for coupling. The thin-film IC attached on the card is so thin that the substrate and IC can be wired to each other by printing ink, thereby making it possible to fabricate an IC card which is low in cost and flat in shape.

The methods described above are applicable not only to IC cards but also to the packaging of ICs of similar types and multichip packaging as well.

Taking a sectional view of a flat IC card in bent condition, a curved surface develops an elongation and the reverse side thereof a compression. Under this condition, the central portion of the particular section of the IC card is subjected to less stress and free of compression. A thin IC chip present at this portion is subjected to lesser stress. The thinner the IC chip, the better. When the card is thick, however, the IC chip can be increased in thickness to some degree since the increased critical curvature of the card makes it difficult to bend due to card rigidity. When the IC card is thin, by contrast, the thickness of the IC chip must be reduced in order to facilitate bending and hence to relax the stress in the IC chip. In reducing the thickness of the IC, the thinner the LSI, the higher accuracy is required of the fabrication equipment. Changing the required thickness of the IC chip according to the thickness of the IC card is very important from the economic viewpoint and also for securing the reliability. In view of this correlation present between the thickness of the IC card and that of the IC chip, the proper thickness of the IC chip is considered 110 microns or less for the thickness of a completed IC card of 760 microns or more, 19 microns or less for the thickness of a completed IC card of 500 microns or more, and 4 microns or less for the completed IC card thickness of 250 microns or more. Thus an economical and highly reliable IC card is produced.

What is claimed is:

1. An IC card including an LSI chip interposed between flexible substrates,
   wherein a critical curvature of said LSI chip is smaller than that of said IC card, and
   wherein a neutral plane of said LSI chip is disposed within ±5% of one-half of the thickness of said IC card from the neutral plane of said IC card.

2. An IC card according to claim 1, wherein said IC card has a thickness greater than or equal to 760 μm and said LSI chip has a thickness of less than or equal to 110 μm.

3. An IC card according to claim 1, wherein said IC card has a thickness greater than or equal to 500 μm and said LSI chip has a thickness less than or equal to 19 μm.

4. An IC card according to claim 1, wherein said IC card has a thickness greater than or equal to 250 μm and said LSI chip has a thickness less than or equal to 4 μm.

5. An IC card according to claim 1, wherein said IC card has a thickness greater than 760 μm and said LSI chip has a thickness less than 110 μm.

6. An IC card according to claim 1, wherein said IC card has a thickness greater than 500 μm and said LSI chip has a thickness less than 19 μm.

7. An IC card according to claim 1, wherein said IC card has a thickness greater than 250 μm and said LSI chip has a thickness less than 4 μm.

8. An IC card according to claim 1, wherein said LSI chip is disposed inbetween layers of metal material.

9. An IC card according to claim 1, wherein said LSI chip is connected to a conductor having a coil pattern.

10. An IC card including an LSI chip interposed between flexible substrates,
    wherein a critical curvature of said LSI chip is smaller than that of said IC card, and
    wherein said flexible substrates for interposing therebetween said LSI chip are card shaped and have the same width.

11. A method for fabricating an IC card including an LSI chip interposed between flexible substrates, comprising:
    forming a plurality of LSI chips on a silicon-on-insulator (SOI) wafer;
    eliminating a support substrate made of silicon from a rear side of said SOI wafer to form an LSI chip which has a critical curvature smaller than that of said IC card;
    electrically connecting said LSI chip to wiring formed on a first of said flexible substrates; and
    covering said LSI chip with a second of said flexible substrates, wherein a neutral plane of said LSI chip is disposed within ±5% of one-half of the thickness of said IC card from the neutral plane of said IC card.

12. A method for fabricating an IC card according to claim 11, wherein said LSI chip and said wiring is connected by hardening conductive material.

13. A method for fabricating an IC card including an LSI chip interposed between a pair of flexible substrates, comprising:
    forming a plurality of LSI chips on a semiconductor wafer;
    eliminating a rear side of said semiconductor wafer to form an LSI chip which has a critical radius of curvature smaller than that of said IC card;
    electrically connecting said LSI chip to wiring formed on a first of said pair of flexible substrates by a conductive ink; and
    covering said LSI chip with the second of said pair of flexible substrates, wherein a neutral plane of said LSI chip is disposed within ±5% of one-half of the thickness of said IC card from the neutral plane of said IC card.

14. A method for fabricating an IC card according to claim 13, wherein said IC card has a thickness greater than or equal to 760 μm and said LSI chip has a thickness less than or equal to 110 μm.

15. A method for fabricating an IC card according to claim 13, wherein said IC card has a thickness greater than or equal to 500 μm and said LSI chip has a thickness less than or equal to 19 μm.

16. A method for fabricating an IC card according to claim 13, wherein said IC card is a card shaped semiconductor apparatus having a thickness greater than or equal to 250 μm and said LSI chip has a thickness less than or equal to 4 μm.

17. A method according to claim 13, wherein said IC card has a thickness greater than 760 μm and said LSI chip has a thickness less than 110 μm.

18. A method according to claim 13, wherein said IC card has a thickness greater than 500 μm and said LSI chip has a thickness less than 19 μm.

19. A method according to claim 13, wherein said IC card is a card shaped semiconductor apparatus having a thickness greater than 250 μm and said LSI chip has a thickness less than 4 μm.

20. A method of fabricating an IC card according to claim 13, wherein said pair of flexible substrates have thicknesses which are the same.

21. A method for fabricating an IC card according to claim 13, wherein said LSI chip and said wiring are connected by hardening conductive material.

22. A method for fabricating an IC card according to claim 21, wherein the hardened conductive material is printed by a rotating drum.

23. A method for fabricating an IC card according to claim 13, wherein said wiring is formed by a rotating drum.

24. A method for fabricating an IC card according to claim 13, wherein a rear side of said LSI chip is formed with silicon nitride film.

25. A method for fabricating an IC card including an LSI chip interposed between flexible substrates, comprising:
    preparing a flexible LSI chip;
    electrically connecting said LSI chip to wiring formed on a first of said flexible substrates; and
    covering said LSI chip with a second of said flexible substrates, wherein a neutral plane of said LSI chip is disposed within ±5% of one-half of the thickness of said IC card from the neutral plane of said IC card.

26. A method for fabricating an IC card according to claim 25, wherein said IC card is covered by plastic or metal material.

* * * * *